United States Patent [19]
Suita et al.

[11] Patent Number: 5,400,145
[45] Date of Patent: Mar. 21, 1995

[54] MARK POSITION DETECTING METHOD AND DEVICE FOR ALIGNER AND ALIGNER HAVING THE DEVICE

[75] Inventors: Makio Suita; Hironobu Kitajima; Masaki Yamabe, all of Kawasaki, Japan

[73] Assignee: Fujitsu Limited, Kawasaki, Japan

[21] Appl. No.: 32,237

[22] Filed: Mar. 17, 1993

[30] Foreign Application Priority Data

Mar. 17, 1992 [JP] Japan .................................. 4-058508

[51] Int. Cl.$^6$ ...................... G01B 11/27; G01B 11/00
[52] U.S. Cl. ...................................... 356/401; 250/348
[58] Field of Search ................ 356/401, 400; 250/348

[56] References Cited

U.S. PATENT DOCUMENTS

| | | | |
|---|---|---|---|
| 4,601,575 | 7/1986 | Tamaki | 356/124 |
| 4,644,172 | 2/1987 | Sandland et al. | 356/400 |
| 5,184,196 | 2/1993 | Nakagawa et al. | 356/401 |
| 5,189,494 | 2/1993 | Muraki | 356/401 |
| 5,222,112 | 6/1993 | Teiasawa et al. | 250/492.2 |

*Primary Examiner*—R. Hille
*Assistant Examiner*—Alexander Oscar Williams
*Attorney, Agent, or Firm*—Staas & Halsey

[57] ABSTRACT

Regarding a reflected light from any line portion, which is parallel to the longitudinal direction of the alignment mark 11, on the alignment mark 11, the cylindrical lens 33 functions merely as a glass plate, while the cylindrical lens 34 converges the light onto a pixel on the line sensor 35a, performing optical integration and simplifying image processing. Regarding a reflected light from any line portion, which is parallel to the lateral direction of the alignment mark 11, on the alignment mark 11, the cylindrical lens 34 functions merely as a glass plate, while the cylindrical lens 33 magnifies and forms a line image on the line sensor 35a along the pixel row of that. A toroidal lens can be used in place of the cylindrical lenses 33 and 34.

15 Claims, 9 Drawing Sheets

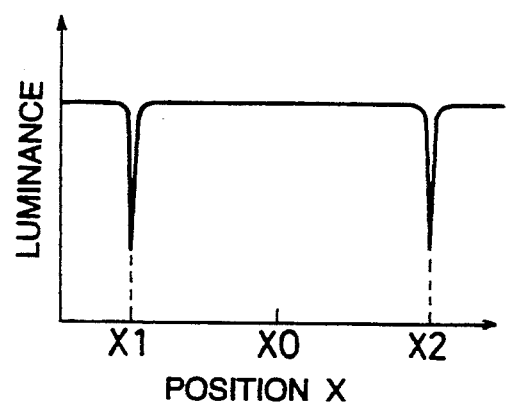
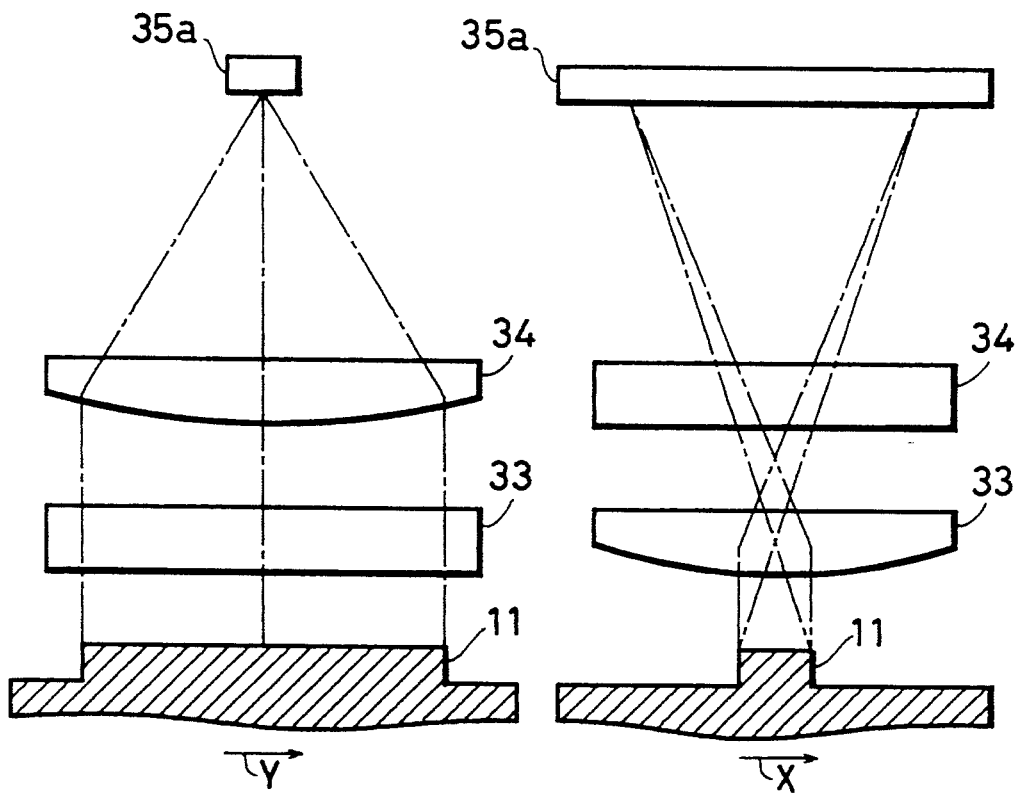
FIG.2C
FIG.2A    FIG.2B

MARK POSITION DETECTING METHOD AND DEVICE FOR ALIGNER AND ALIGNER HAVING THE DEVICE

BACKGROUND OF THE INVENTION

1. Field of the Invention

The present invention relates to a mark position detecting method and device for an aligner, which align between a mask and a semiconductor wafer and expose patterns on the mask onto the wafer, the method and device detecting a position of a rectangular mark formed on the wafer or the mask, and an aligner having such a mark position detecting device.

2. Description of the Prior Art

FIG. 8 shows a portion of conventional proximity aligner. The aligner is designed to align an alignment mark 13 on a mask 12 relatively to an alignment mark 11 on a semiconductor wafer 10. The wafer 10 is placed on a wafer stage 14, while the mask 12 is, for example, electrostatically absorbed to a mask stage 16 through a mask ring 15 fixed to the peripheral portion of the mask 12. A metallurgical microscope barrel 18 is mounted on a base plate of the mask stage 16 through a microscope stage 17. A light emitting from a white light source 19 passes along an optical fiber 20, through a half-mirror 21 and an objective lens 23 which are disposed inside the metallurgical microscope barrel 18, and then irradiates the wafer 10 and the mask 12. A reflected light from either the wafer 10 or the mask 12 passes through the objective lens 23, is reflected by the half-mirror 21, and is then formed into an image on a CCD in a two-dimensional camera 25 through a relay lens 24.

A video signal and synchronizing signals, which are output from the two-dimensional camera 25, are supplied to an image input unit 26. The image input unit 26 converts the video signal into a digital signal as a luminance data and generates an address on the basis of the synchronizing signal so as to store the luminance data at that address in an image memory 27. An image processing unit 28 detects a relative position of the alignment mark 11 with respect to the alignment mark 13 by processing the image stored in the image memory 27, and supplies the detected relative position to a controller 29. The controller 29 controls moving of either the wafer stage 14 or the mask stage 16 such that the relative position becomes a preset value, for example, 0. The alignment mark 11 can accurately be aligned to the alignment mark 13 by repeating the above-described aligning process a few times.

According to the standard, it takes 1/30 second for the two-dimensional camera 25 to output image data of one frame. Therefore, if the above-described aligning process is repeated, for example, three times, the image taking-in operation alone requires 0.1 second, thus reducing the throughput of the exposure process.

On a two-dimensional image 27a, shown in FIG. 9, in the image memory 27, a window W is set at the central portion thereof. In this window W, luminance data are accumulated in a direction indicated by Y in FIG. 9A for the purpose of averaging out the image signals, and an X-axis projected luminance distribution shown in FIG. 9B is obtained. Positions X1 and X2 of the negative peaks corresponding to the two edges of the alignment mark 11 are obtained, and the mean value thereof, $X0=(X1+X2)/2$, is obtained as the X-directional representative position of an alignment mark 11. In this way, the representative position X0 of the alignment mark 11 having a width from several to several tens of $\mu m$ can be detected accurately.

However, in the above-described position detection method, it takes a long time for accumulation in the Y direction, reducing the throughput of the exposure process. The above-described problem also arises in a projection aligner.

SUMMARY OF THE INVENTION

In view of the aforementioned problems of the prior art, an object of the present invention is to provide a mark position detecting method and device for an aligner of which the device is capable of detecting the position of a rectangular mark at a high speed, and an aligner which is capable of a high-speed aligning.

According to one aspect of the present invention, there is provided a mark position detecting method for aligning between a mask and a semiconductor wafer and exposing a pattern on the mask onto the wafer, the method detecting a position of a rectangular mark formed on an object which is either the wafer or the mask, the method comprising the steps of: positioning the object such that one of two sides thereof becomes parallel to an X-direction and the other of the two sides becomes parallel to a Y-direction which is perpendicular to the X-direction; illuminating an area on the object, the area covering the rectangular mark; converging a first reflected light onto a pixel of a line sensor and forming a second reflected light into a image on the line sensor along a pixel row of the line sensor, the first reflected light being from a first line portion in the area, the first line portion being parallel to the Y-direction, the second reflected light being from a second line portion in the area, the second line portion being parallel to the X-direction; and processing an output signal from the line sensor so as to detect a X-directional representative position of the rectangular mark.

According to another aspect of the present invention, there is provided a mark position detecting device for an aligner which aligns between a mask and a semiconductor wafer and exposes a pattern on the mask onto the wafer, the device detecting a position of a rectangular mark formed on an object which is either the wafer or the mask, the object being positioned such that one of two sides thereof become parallel to an X-direction and the other of the two sides become parallel to a Y-direction which is perpendicular to the X-direction, the device comprising: a one-dimensional camera having a line sensor; a light source for illuminating an area on the object, the area covering the rectangular mark; optical means for converging a first reflected light onto a pixel of the line sensor, the first reflected light being from a first line portion in the area, the first line portion being parallel to the Y-direction and for forming a second reflected light into a image on the line sensor along a pixel row of the line sensor, the second reflected light being from a second line portion in the area, the second line portion being parallel to the X-direction; and signal processing means for processing an output signal from the one-dimensional camera so as to detect a X-directional representative position of the rectangular mark.

In the above-described mark position detecting method and device for the aligner, since the optical means converges a reflected light, which come from a line portion parallel to the Y-direction, onto a pixel of the line sensor, accumulation of the luminances along the Y direction, i.e., optical integration thereof, is performed. Consequently, the image processing can be simplified, and the position of the rectangular mark can thus be detected at a high speed.

Moreover, since the number of pixels of a line sensor is generally larger than that of one row pixels of a two-dimensional image sensor, the position of the rectangular mark can thus be detected more accurately.

In one form of the above-described invention, the optical means comprising: a first cylindrical lens for converging a first reflected light onto a pixel of the line sensor, the first reflected light being from a first line portion in the area, the first line portion being parallel to the Y-direction; and a second cylindrical lens for forming a second reflected light into a image on the line sensor along a pixel row of the line sensor, the second reflected light being from a second line portion in the area, the second line portion being parallel to the X-direction.

In another form of the above-described invention, the optical means is a toroidal lens.

According to a further aspect of the present invention, there is provided an aligner for aligning between a mask and a semiconductor wafer and for exposing a pattern on the mask onto the wafer, the aligner detecting a position of a rectangular mark formed on an object which is either the wafer or the mask, the aligner comprising: a movable stage on which the object is placed such that one of two sides thereof become parallel to an X-direction and the other of the two sides become parallel to a Y-direction which is perpendicular to the X-direction; a one-dimensional camera having a line sensor; a light source for illuminating an area on the object, the area covering the rectangular mark; optical means for converging a first reflected light onto a pixel of the line sensor, the first reflected light being from a first line portion in the area, the first line portion being parallel to the Y-direction, and for forming a second reflected light into a image on the line sensor along a pixel row of the line sensor, the second reflected light being from a second line portion in the area, the second line portion being parallel to the X-direction; signal processing means for processing an output signal from the one-dimensional camera so as to detect a X-directional representative position of the rectangular mark; and control means for controlling moving of the movable stage such that the X-directional representative position of the rectangular mark is positioned at a target position.

In the above-described aligner, since the mark position detecting device which has the above-described structure is employed, a high speed aligning is possible.

Other objects, features and advantages of the present invention will become apparent from the following description taken in connection with the accompanying drawings.

BRIEF DESCRIPTION OF THE DRAWINGS

FIG. 2A illustrates the principle of light convergence in the device shown in FIG. 1 with respect to a longitudinal direction of an alignment mark;

FIG. 2B illustrates the principle of image magnification and formation in the device shown in FIG. 1 with respect to a lateral direction of the alignment mark;

FIG. 2C shows a luminance distribution on a line sensor shown in FIGS. 2A and 2B;

DETAILED DESCRIPTION OF THE PREFERRED EMBODIMENTS

Now the present invention will be described in detail in connection with the following embodiment.

First Embodiment

Figure 1:
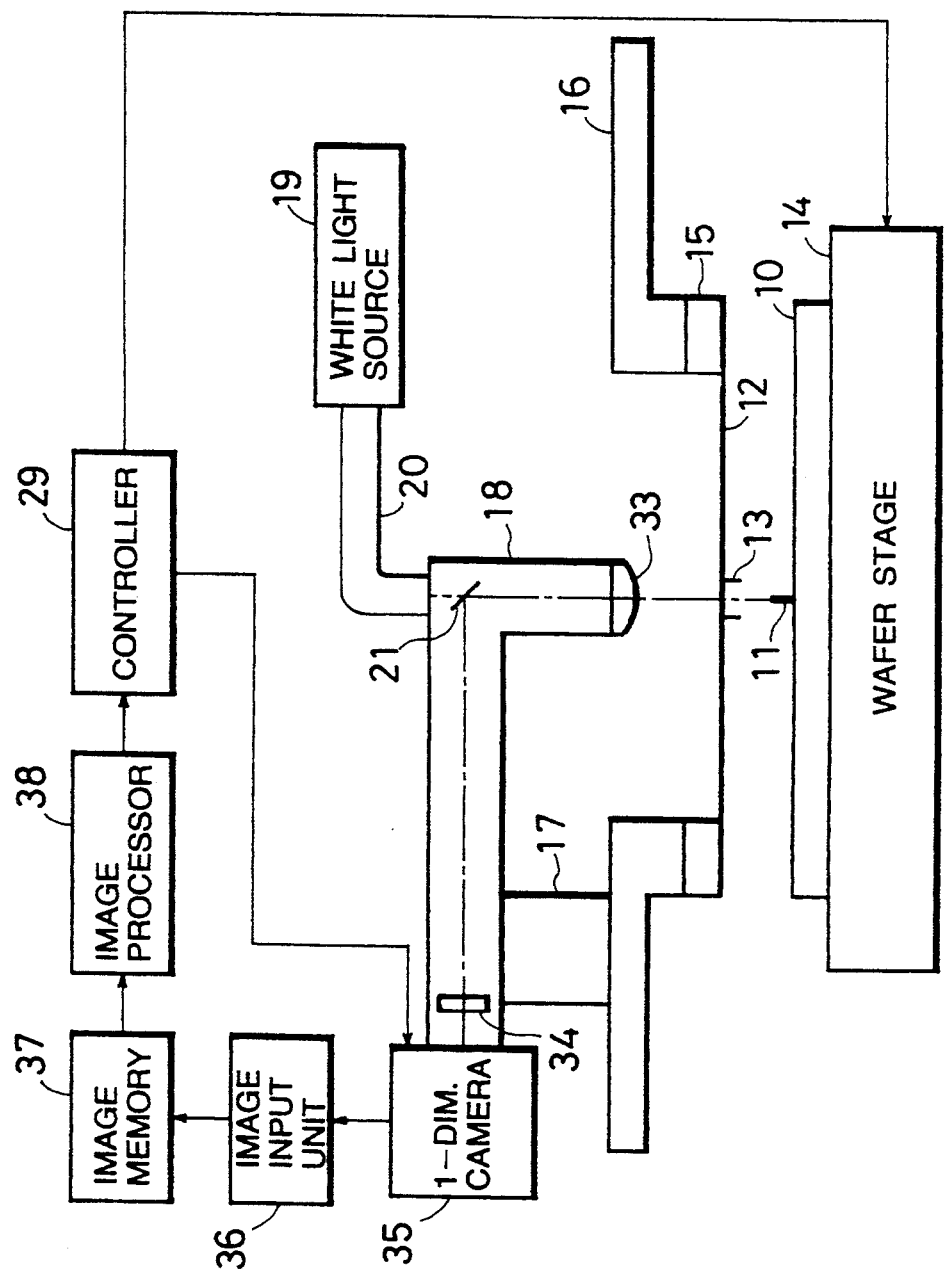
FIG. 1 is a schematic view of a portion of a proximity aligner showing a first embodiment of the present invention.

FIG. 1 shows the structure of a portion of an aligner which aligns between a mask 12 and a semiconductor wafer 10 and exposes a pattern on the mask 12 onto the wafer 10. The aligner has a device for detecting a position of a rectangular mark 11 or 13 formed on the wafer 10 or the mask 12 respectively. The same elements in FIG. 1 as those in FIG. 8 previously described are designated by the same reference numerals, and description thereof is thus omitted.

Figure 8:
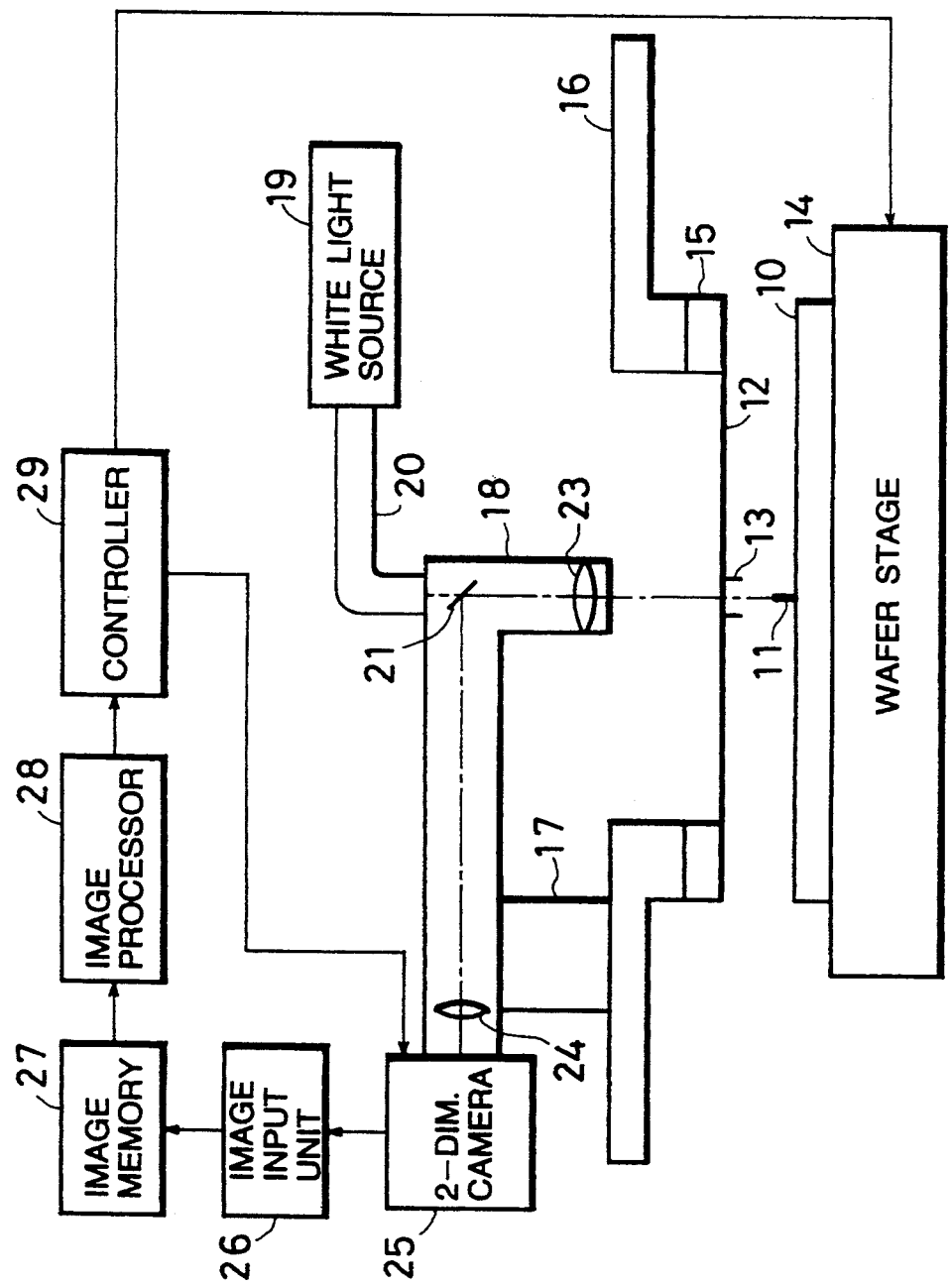
FIG. 8 is a schematic view of a portion of conventional proximity aligner.

In the aligner, a one-dimensional camera 35 is provided in place of the two-dimensional camera 25 shown in FIG. 8, and a cylindrical lens 33 and a cylindrical lens 34 are respectively provided in place of the objective lens 23 and the relay lens 24 shown in FIG. 8.

The one-dimensional camera 35 comprises a line sensor 35a which is, for example, a CCD, a driver for the line sensor, and an amplifier for amplifying the output of the line sensor, but does not comprise a image forming lens.

The cylindrical lenses 33 and 34 are disposed such that they satisfy the relations shown in FIGS. 2A and 2B. A longitudinal cross-section of the alignment mark 11 is shown in FIG. 2A and a lateral cross-section, which is perpendicular to the longitudinal cross-section, of that is shown in FIG. 2B.

The alignment mark 11 is a rectangular convexity having, for example, a length of 30 $\mu$m, a width of 5 $\mu$m and a height of 0.1 $\mu$m.

The line sensor 35a is positioned such that the longitudinal direction of that, namely the direction of a row of pixels of the line sensor 35a, becomes parallel to the lateral direction of the alignment mark 11.

The cylindrical lens 33 is arranged such that generating line of the cylindrical lens 33 become perpendicular to the longitudinal direction of the line sensor 35a. While cylindrical lens 34 is arranged between the line sensor 35a and the cylindrical lens 33 such that generating line of the cylindrical lens 34 become parallel to the longitudinal direction of the line sensor 35a.

Figure 9A:
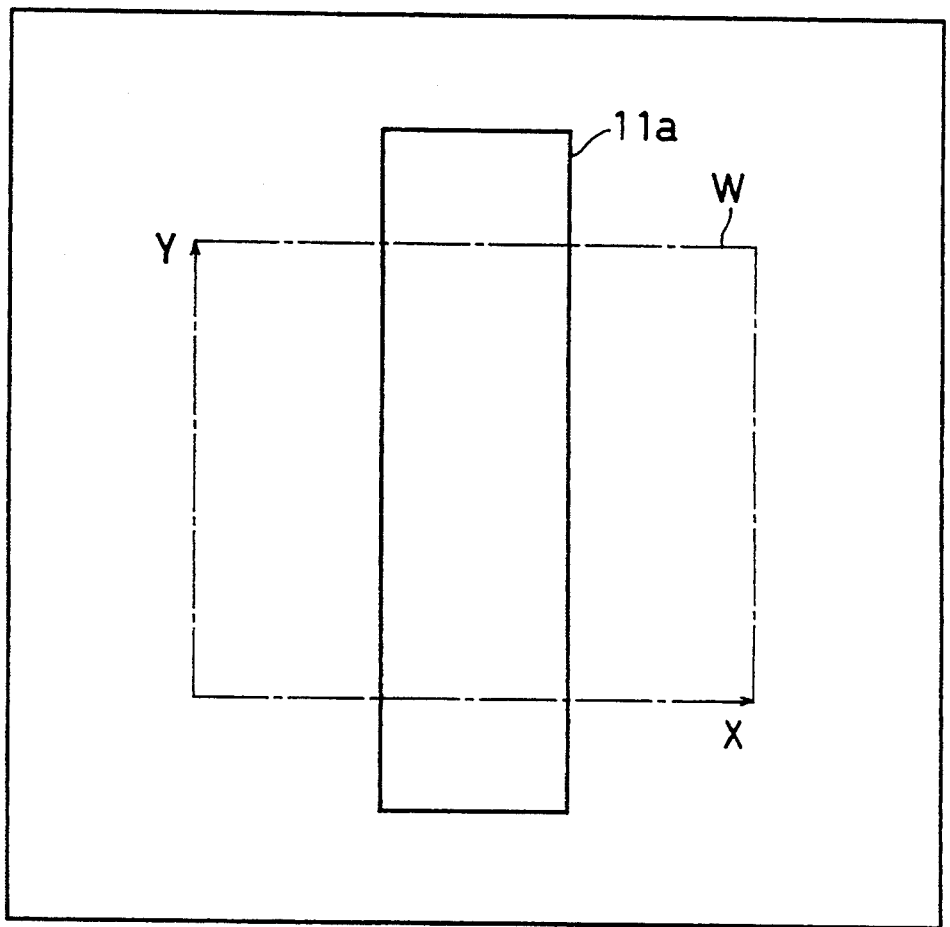
FIG. 9A illustrates an image in an image memory shown in FIG. 8.
Figure 9B:
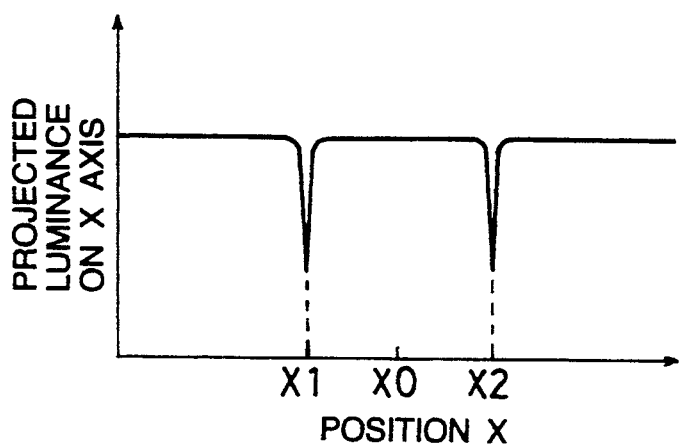
FIG. 9B shows a projected luminance distribution on an X axis of the image shown in FIG. 9A.

As shown in FIG. 2A, in regard to the reflected light from any line portion, which is parallel to the longitudinal direction of the alignment mark 11, on the alignment mark 11, the cylindrical lens 33 functions merely as a glass plate, while the cylindrical lens 34 converges the light onto a pixel on the line sensor 35a. Thus, accumulation of the luminances along the Y direction in FIG. 9, i.e., optical integration, is performed. Consequently, the image processing can be simplified and performed at a high speed.

As shown in FIG. 2B, in regard to the reflected light from any line portion, which is parallel to the lateral direction of the alignment mark 11, on the alignment mark 11, the cylindrical lens 34 functions merely as a glass plate, while the cylindrical lens 33 magnifies and forms an line image on the line sensor 35a along the pixel row of that. Thus, a luminance distribution, such as that shown in FIG. 2C, is obtained from the line sensor 35a. FIG. 2C corresponds to FIG. 9B. Two negative peaks in FIG. 2C exist due to the light interference from the neighborhood of each edge of the alignment mark 11.

Since the image is magnified on the line sensor 35a, as shown in FIG. 2B, even if the pixel pitch of the line sensor 35a is large as compared with the width of the alignment mark 11, e.g., 10 μm, the position of the alignment mark 11 can be accurately detected.

Furthermore, the optical integration shown in FIG. 2A is equivalent to the averaging out the edge position date detected from many points, and this makes possible accurate detection of the X-directional representative position of the alignment mark 11.

Moreover, since number of pixels of a line sensor is generally larger than that of one row pixels of a two-dimensional image sensor, the position of the alignment mark 11 can be accurately detected.

In FIG. 1, the video signal and synchronizing signals which are output from the one-dimensional camera 35 are supplied to an image input unit 36. The image input unit 36 converts the video signal into a digital signal synchronously with the synchronizing signal, and stores the digital signal into an image memory 37 as luminance data.

An image processing unit 38 detects the relative position of the alignment mark 11 with respect to the alignment mark 13 by processing the image stored in the image memory 37, and supplies the detected relative position to the controller 29. As will be described later, the controller 29 controls moving of either the wafer stage 14 or the mask stage 16 such that the relative position becomes a preset value, e.g., 0. In this way, the alignment mark 11 can be accurately aligned to the alignment mark 13.

Figure 3:
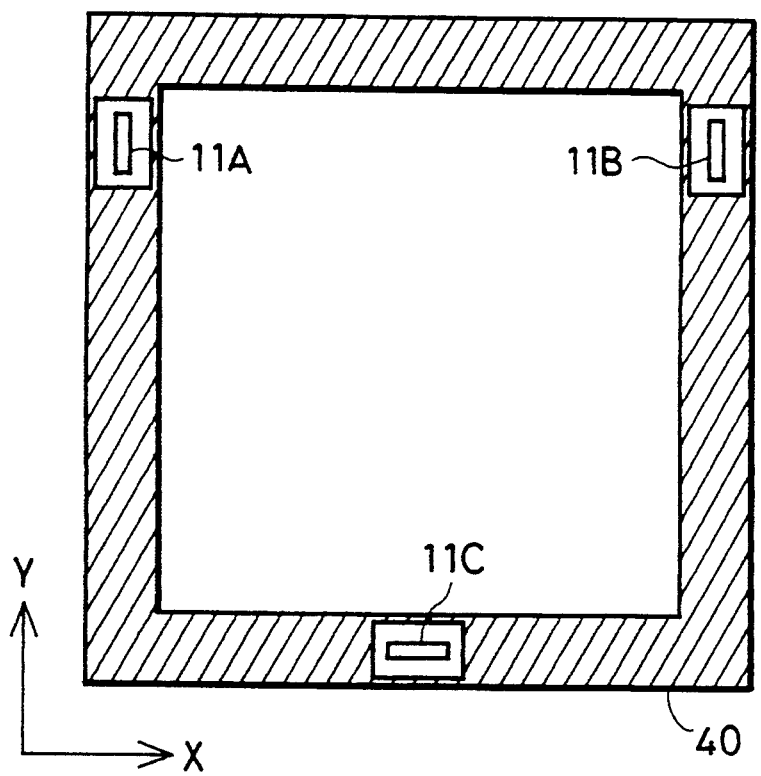
FIG. 3 shows the layout of alignment marks in a scribing line on a wafer.

The components 17 through 21 and 33 through 37 are provided for each of three alignment marks 11A, 11B and 11C, shown in FIG. 3, in a scribing line 40 on the wafer 10. That is, there are three sets of components 17 through 21 and 33 through 37, but FIG. 1 shows only one set in order to simplify the illustration. The image processing unit 38 performs processing on the images obtained by these three component sets. In regard to each of the two component sets provided for the alignment marks 11A and 11B, the direction in which the pixels are arranged in the line sensor is positioned parallel to the X axis. In regard to the remaining set provided for the alignment mark 11C, the direction in which the pixels are arranged in the line sensor is positioned parallel to the Y axis.

Figure 4:
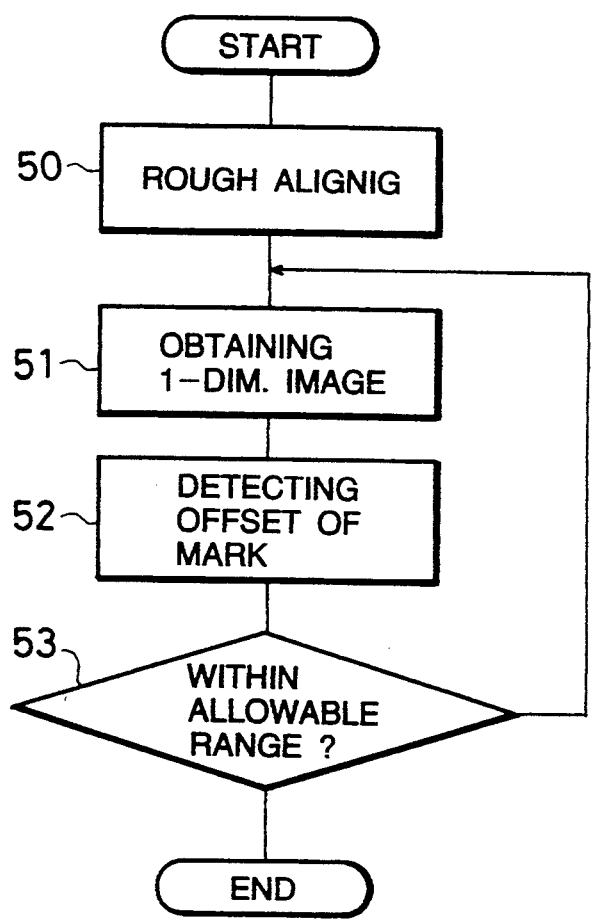
FIG. 4 is a flowchart showing the procedures of aligning.

The procedures of aligning the alignment mark 11 will be described below with reference to FIG. 4. Hereinafter, the numeral in parenthesis indicates the step No. in FIG. 4.

(50) Stored beforehand in the controller 29 are data including the position of the wafer 10 relative to the wafer stage 14, the position of the alignment mark 11 on the wafer 10 and the optical axis position of the cylindrical lens 33 relative to the wafer stage 14 in an initial state. The controller 29 controls moving of the wafer stage 14 on the basis of the positional data such that the alignment mark 11 is positioned on the optical axis of the cylindrical lens 33 as shown in FIG. 2B, whereby the rough aligning process is completed and the subsequent fine aligning process is enabled.

(51) The microscope is automatically focused to the alignment mark 11 by adjusting the microscope barrel stage 17. Next, the wafer 10 is imaged by the one-dimensional camera 35 according to the instruction from the controller 29. The obtained image is stored in the image memory 37.

(52) The image processing unit 38 processes the image stored in the image memory 37, such as that shown in FIG. 2C, to detect the positional offset of the alignment mark, $X0=(X1+X2)/2$, relative to, for example, the central pixel of the line sensor 35a, namely the center of the view field of the microscope. This detection is performed for each of the alignment marks 11A, 11B and 11C shown in FIG. 3.

(53) If the offset detected for each of the alignment marks 11A, 11B and 11C shown in FIG. 3 is within an allowable range, the image processing unit 38 completes the processing. If at least one of the offsets is out of the allowable range, the image processing unit 38 supplies the detected offsets to the controller 29. The controller 29 moves the wafer stage 14 such that each offset becomes 0.

The processings in steps 51 to 53 are generally repeated one or two times. If the number of pixels of the line sensor 35a is approximately 100, the time required for one image taking-in is about 1/3.3 μsec. Therefore, a high-speed aligning is assured.

Prior to aligning of the alignment mark 11, the alignment mark 13 is aligned to the center of the view field of the microscope. This aligning is performed in the same manner as that of the alignment mark 11 except that the microscope is focused to the mask 12 for taking in an image and that the microscope barrel stage 17 is adjusted for aligning. Aligning of the alignment mark 11 relative to the alignment mark 13 is performed by separately performing above-described aligning on both the alignment marks 11 and 13.

The alignment mark 13 shown in FIG. 1 is two parallel rectangular convexity. Therefore, four negative peaks are obtained similar to that of FIG. 2C and the average value of the positions of the four negative peaks is got as the X-directional representative position of the alignment mark 13.

Second Embodiment

Figure 5:
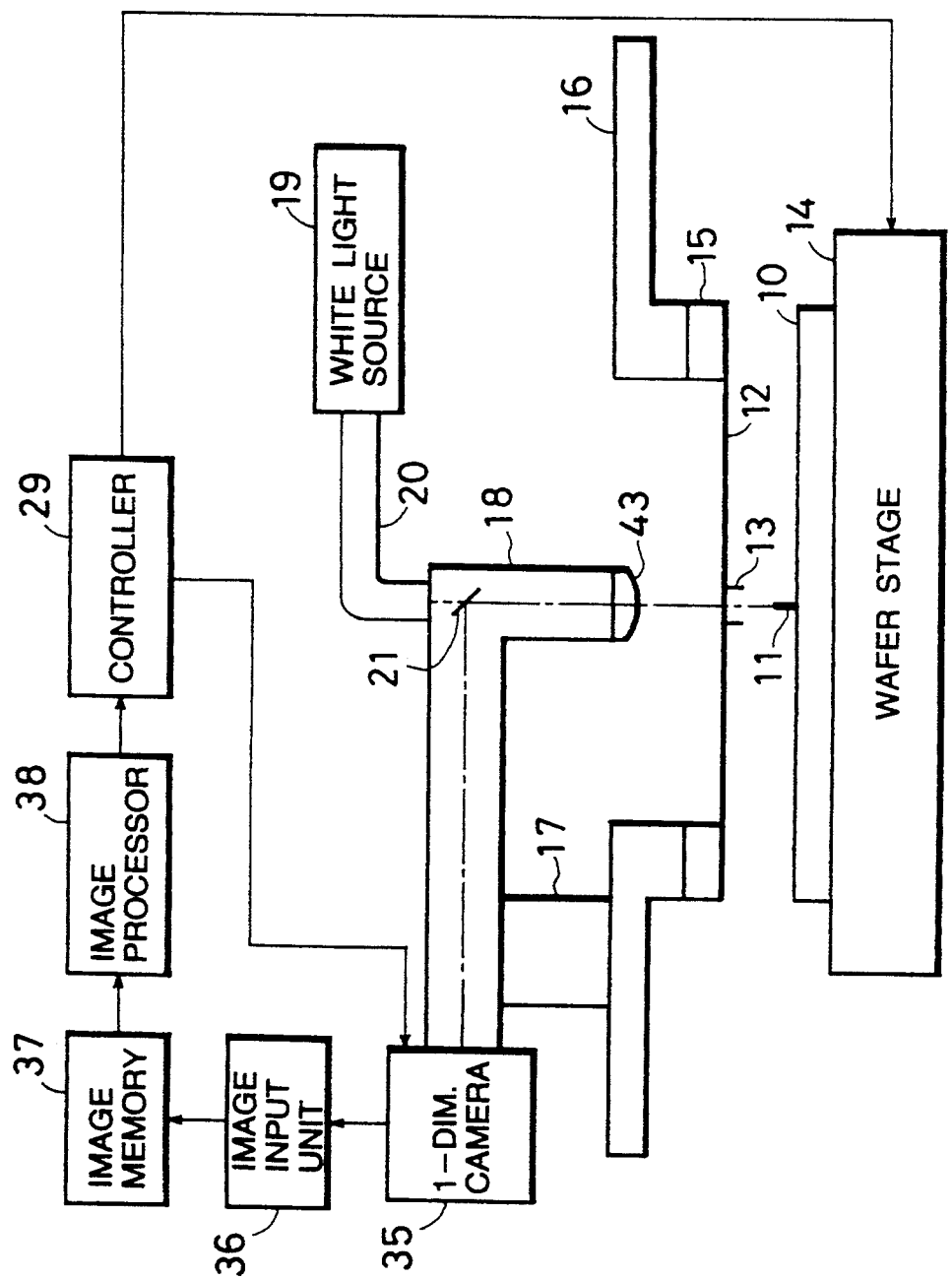
FIG. 5 is a schematic view of a portion of a proximity aligner a second embodiment of the present invention.

FIG. 5 shows the structure of a second embodiment of a portion of a proximity aligner.

The same elements in FIG. 5 as those in FIG. 1 are designated by the same reference numerals, and description thereof is thus omitted.

In the aligner, a toroidal lens 43 is provided in place of the cylindrical lenses 33 and 34 shown in FIG. 1. The toroidal lens 43 is disposed at the position of the cylindrical lens 33, and has the same function as that of the cylindrical lenses 33 and 34.

Figure 6C:
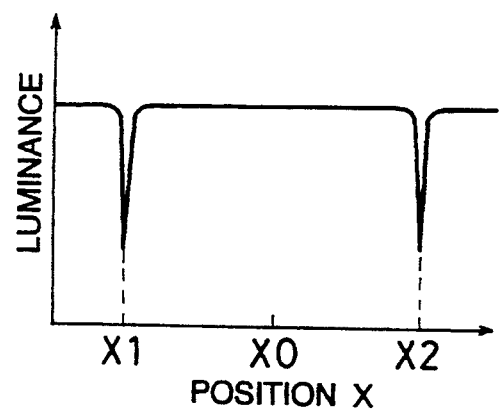
FIG. 6C shows a luminance distribution on a line sensor shown in FIGS. 6A and 6B.
Figures 6A, 6B:
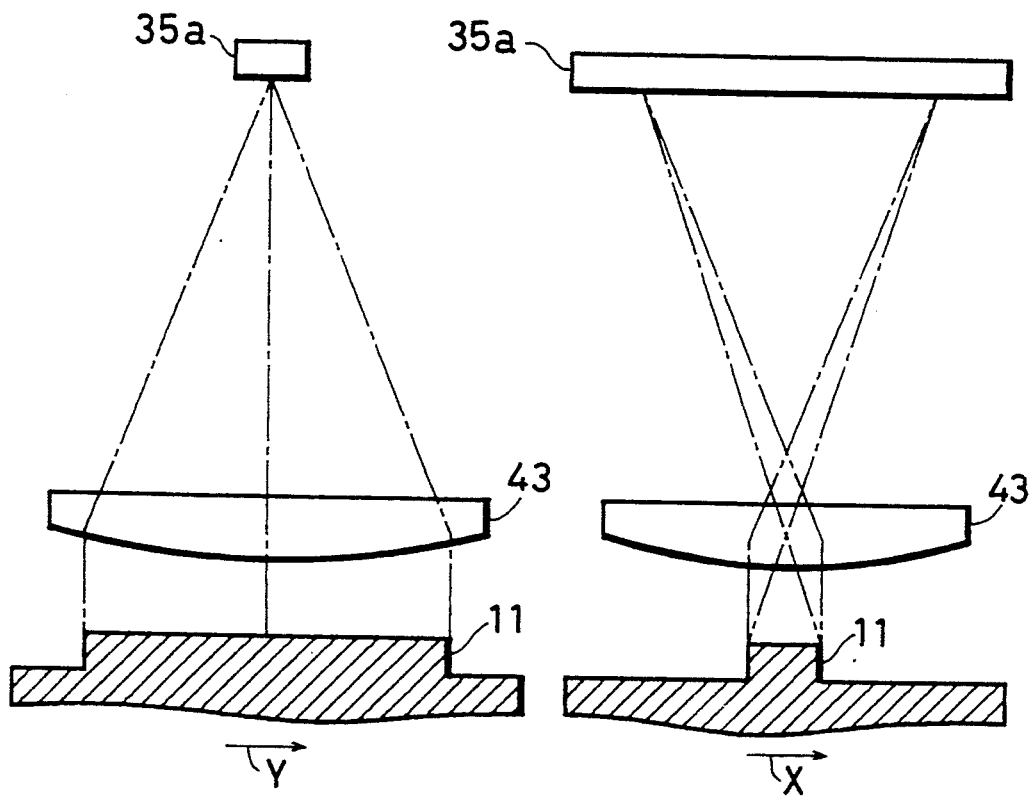
FIG. 6A illustrates the principle of light convergence in the device shown in FIG. 1 with respect to a longitudinal direction of an alignment mark.
FIG. 6B illustrates the principle of image magnification and formation in the device shown in FIG. 1 with respect to a lateral direction of the alignment mark.

The toroidal lens 43 is disposed such that it satisfies the relations shown in FIGS. 6A and 6B. A longitudinal cross-section of the alignment mark 11 is shown in FIG. 6A and a lateral cross-section of that is shown in FIG. 6B.

The line sensor 35a is positioned such that the longitudinal direction of the line sensor 35a becomes parallel to the lateral direction of the alignment mark 11.

The toroidal lens 43 is arranged such that X-directional generating line of the toroidal lens 33 becomes parallel to the longitudinal direction of the line sensor 35a, while Y-directional generating line of the toroidal lens 34 becomes parallel to the lateral direction of the line sensor 35a.

As shown in FIG. 6A, in regard to the reflected light from any line portion, which is parallel to the longitudinal direction of the alignment mark 11, on the alignment mark 11, the toroidal lens 43 functions converges the light onto a pixel on the line sensor 35a. Thus, accumulation of the luminances along the Y direction in FIG. 9, i.e., optical integration, is performed. Consequently, the image processing operation can be simplified and performed at a high speed.

As shown in FIG. 6B, in regard to the reflected light from any line portion, which is parallel to the lateral direction of the alignment mark 11, on the alignment mark 11, the toroidal lens 43 magnifies and forms an line image on the line sensor 35a along the pixel row of that. Thus, a luminance distribution, such as that shown in FIG. 6C, is obtained from the line sensor 35a. FIG. 6C corresponds to FIG. 2C.

The other structure of the second embodiment is the same as that of the first embodiment.

Third Embodiment

Figure 7:
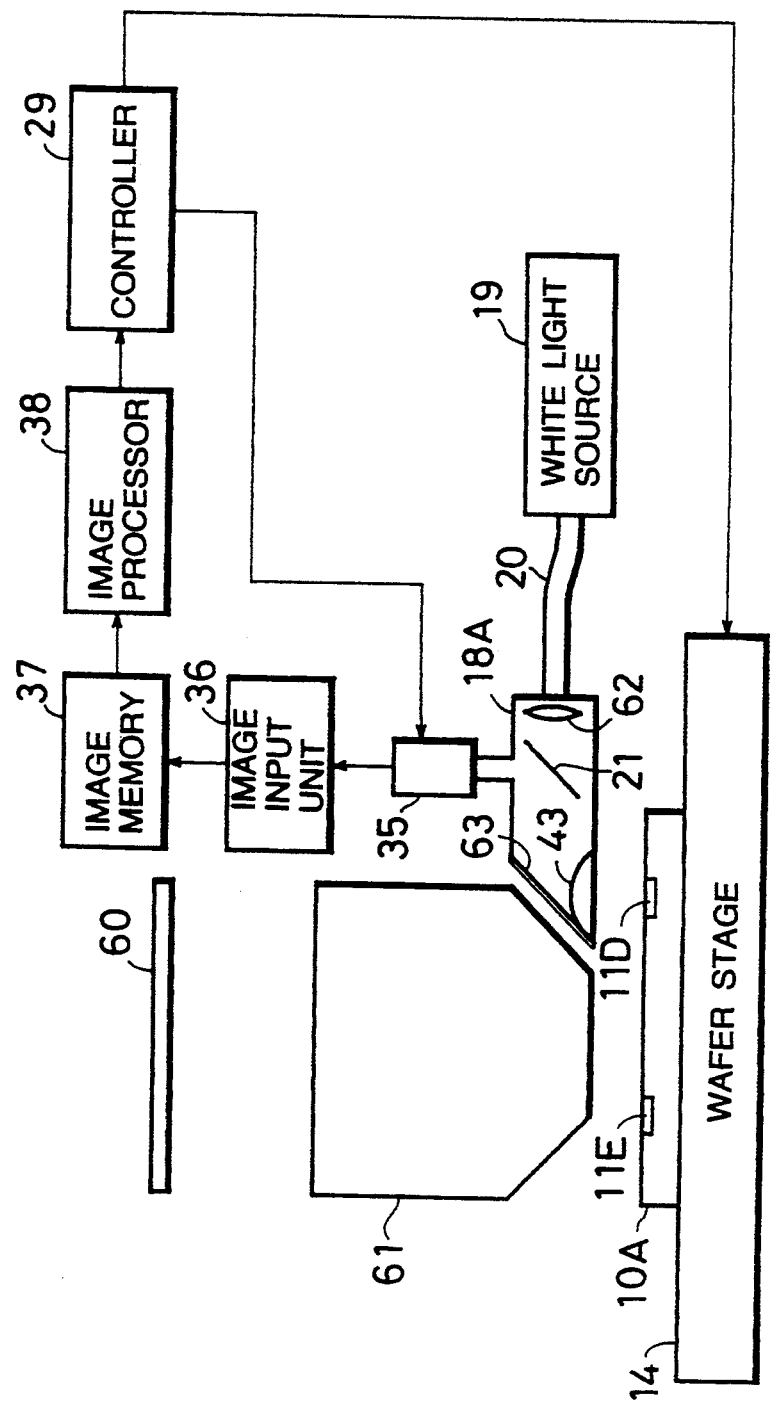
FIG. 7 is a schematic view of a portion of a projection aligner showing a third embodiment of the present invention.

FIG. 7 shows the structure of a third embodiment of a portion of a projection aligner. Similar or identical elements in FIG. 7 to those in FIG. 5 are designated by the similar or identical reference numerals, and description thereof is thus omitted.

A wafer 10A placed on the wafer stage 14 has alignment marks 11D and 11E each of which is a rectangular concavity. Above the wafer stage 14 are provided a reticle 60 and a projection lens 61 for projecting the patterns on the reticle 60 onto the wafer 10.

The mark position detecting device is disposed beside the exposure device. The mark position detecting device further comprises a convex lens 62 and a mirror 63 located within a metallurgical microscope barrel 18A in addition to the structure shown in FIG. 5.

A light emitting from the white light source 19 passes along the optical fiber 20, through the convex lens 62 and the half-mirror 21, is reflected by the mirror 63, passes through the toroidal lens 43, and then irradiates the vicinity of the alignment mark 11D. A reflected light from a wafer 10A passes through the toroidal lens 43, is reflected by the mirror 63 first and then by the half-mirror 21, and is made incident on the one-dimensional camera 35. The light incident on the line sensor of the one-dimensional camera 35 is converged and formed in the same manner as those shown in FIGS. 6A and 6B.

Aligning of the alignment mark lid on the wafer 10A is performed in the same manner as that of the first embodiment. Aligning of an alignment mark on the reticle 60 may be performed by a known method in which the position of the alignment mark is detected by scanning the reticle 60 with a laser beam.

Having described specific embodiments of the present invention, it is to be understood that modification and variation of the invention are possible without departing from the spirit and scope thereof.

For example, the alignment mark can have any rectangular shape, e.g., a square shape. There is no limitation to the number of rectangular patterns which constitute the alignment mark, and at least one alignment pattern is provided. Aligning of the alignment mark is performed not only to the central pixel of the line sensor but also any other pixel.

What is claimed is:

1. A mark position detecting method for aligning between a mask and a semiconductor wafer and exposing a pattern on said mask onto said wafer, said method detecting a position of a rectangular mark formed on an object which is either said wafer or said mask, said method comprising the steps of:

positioning said object such that one of two sides of said rectangular mark becomes parallel to an X-direction and the other of said two sides becomes parallel to a Y-direction which is perpendicular to said X-direction;

illuminating an area on said object, said area covering said rectangular mark;

converging a reflected light onto a line sensor with respect to a cross section of said line sensor and forming said reflected light into a magnified image on said line sensor with respect to a longitudinal section of said line sensor, said reflected light being from said area, said cross section being parallel to said Y-direction, said longitudinal section being parallel to said X-direction; and processing an output signal from said line sensor so as to detect an X-directional representative position of said rectangular mark.

2. A mark position detecting method according to claim 1, wherein said step of converging and forming comprises the steps of:

converging said reflected light Onto said line sensor with respect to said cross section of said line sensor by a first cylindrical lens; and forming said reflected light into said magnified image on said line sensor with respect to said longitudinal section of said line sensor by a second cylindrical lens.

3. A mark position detecting method according to claim 1, wherein said step of converging and forming is executed by a toroidal lens.

4. A mark position detecting method according to claim 1, wherein said step of processing comprises the steps of:

converting said output signal from said line sensor into a digital signal;

writing said digital signal into a read/write storage device;

reading a content out of said read/write storage device and calculating a mean position of a Y-directional edge of said rectangular mark; and outputting said mean position as said X-directional representative position of said rectangular mark.

5. A mark position detecting method according to claim 4, wherein said step of illuminating is executed by a white light source.

6. A mark position detecting device for an aligner which aligns between a mask and a semiconductor wafer and exposes a pattern on said mask onto said wafer, said device detecting a position of a rectangular mark formed on an object which is either said wafer or said mask, said object being positioned such that one of two sides of said rectangular mark becomes parallel to an X-direction and the other of said two sides becomes parallel to a Y-direction which is perpendicular to said X-direction, said device comprising:

a line sensor;

a light source for illuminating an area on said object, said area covering said rectangular mark;

optical means for converging a reflected light onto said line sensor with respect to a cross section of said line sensor and forming said reflected light into a magnified image on said line sensor with respect to a longitudinal section of said line sensor, said reflected light being from said area, said cross section being parallel to said Y-direction, said longitudinal section being parallel to said X-direction; and signal processing means for processing an output signal from said line sensor so as to detect an X-directional representative position of said rectangular mark.

7. A mark position detecting device according to claim 6, wherein said optical means includes:

a first cylindrical lens for converging said reflected light onto said line sensor with respect to said cross section of said line sensor; and a second cylindrical lens for forming said reflected light into said magnified image on said line sensor with respect to said longitudinal section of said line sensor.

8. A mark position detecting device according to claim 6, wherein said optical means is a toroidal lens.

9. A mark position detecting device according to claim 6, wherein said signal processing means includes:

a read/write storage device;

image input means for converting said output signal from said line sensor into a digital signal and for writing said digital signal into said read/write storage device; and image processing means for reading a content out of said read/write storage device, for calculating a mean position of a Y-directional edge of said rectangular mark and for outputting said mean position as said X-directional representative position of said rectangular mark.

10. A mark position detecting device according to claim 9, wherein said light source is a white light source.

11. An aligner for aligning between a mask and a semiconductor wafer and for exposing a pattern on said mask onto said wafer, said aligner detecting a position of a rectangular mark formed on an object which is either said wafer or said mask, said aligner comprising:

a movable stage on which said object is placed such that one of two sides of said rectangular mark becomes parallel to an X-direction and the other of said two sides becomes parallel to a Y-direction which is perpendicular to said X-direction;

a line sensor;

a light source for illuminating an area on said object, said area covering said rectangular mark;

optical means for converging a reflected light onto said line sensor with respect to a cross section of said line sensor and forming said reflected light into a magnified image on said line sensor with respect to a longitudinal section of said line sensor, said reflected light being from said area, said cross-section being parallel to said Y-direction, said longitudinal section being parallel to said X-direction;

signal processing means for processing an output signal from said line sensor so as to detect an X-directional representative position of said rectangular mark; and control means for controlling moving of said movable stage such that said X-directional representative position of said rectangular mark is positioned at a target position.

12. An aligner according to claim 11, wherein said optical means includes:

a first cylindrical lens for converging said reflected light onto said line sensor with respect to said cross section of said line sensor; and a second cylindrical lens for forming said reflected light into said magnified image on said line sensor with respect to said longitudinal section of said line sensor.

13. An aligner according to claim 11, wherein said optical means is a toroidal lens.

14. An aligner according to claim 11, wherein said signal processing means includes:

a read/write storage device;

image input means for converting said output signal from said line sensor into a digital signal and for writing said digital signal into said read/write storage device; and image processing means for reading a content out of said read/write storage device, for calculating a mean position of a Y-directional edge of said rectangular mark and for outputting said mean position as said X-directional representative position of said rectangular mark.

15. An aligner according to claim 14, wherein said light source is a white light source.

* * * * *